· US006331459B1

United States Patent
Gruening

(10) Patent No.: US 6,331,459 B1
(45) Date of Patent: Dec. 18, 2001

(54) USE OF DUMMY POLY SPACERS AND DIVOT FILL TECHNIQUES FOR DT-ALIGNED PROCESSING AFTER STI FORMATION FOR ADVANCED DEEP TRENCH CAPACITOR DRAM

(75) Inventor: Ulrike Gruening, Wappingers Falls, NY (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/252,372

(22) Filed: Feb. 18, 1999

(51) Int. Cl.$^7$ .................................................. H01L 21/8242
(52) U.S. Cl. ............................ 438/243; 438/246; 438/248
(58) Field of Search ........................................ 438/243–249, 438/386–392

(56) References Cited

U.S. PATENT DOCUMENTS 4,830,978 * 5/1989 Teng et al. .
5,395,786 * 3/1995 Hsu et al. .
5,529,944 * 6/1996 Rajeevakumar .
5,543,348 * 8/1996 Hammerl et al. .

* cited by examiner

Primary Examiner—Jey Tsai
(74) Attorney, Agent, or Firm—Stanton C. Braden

(57) ABSTRACT

A method of forming a dynamic random access memory cell in a semiconductor substrate. The cell has a transistor in an active area of the semiconductor substrate electrically coupled to a storage capacitor through a buried strap or coupling region. The method includes forming an electrode for the capacitor in a lower portion of a trench in the semiconductor substrate. A sacrificial material is formed on the sidewall portion of the trench, such sacrificial material extending from the surface of the semiconductor substrate into the substrate beneath the surface of the semiconductor substrate. The active area for the transistor is delineated and includes forming a covering material over the surface of the semiconductor substrate with a portion of the sacrificial material being projecting through the covering material to expose such portion of the sacrificial material. Subsequent to the delineation of the active area, the covering material and the exposed portion of the sacrificial material are subjected to an etch to selectively remove the sacrificial material while leaving the covering material, such removed sacrificial material exposing the first region of a semiconductor substrate disposed beneath a surface of such substrate.

36 Claims, 14 Drawing Sheets

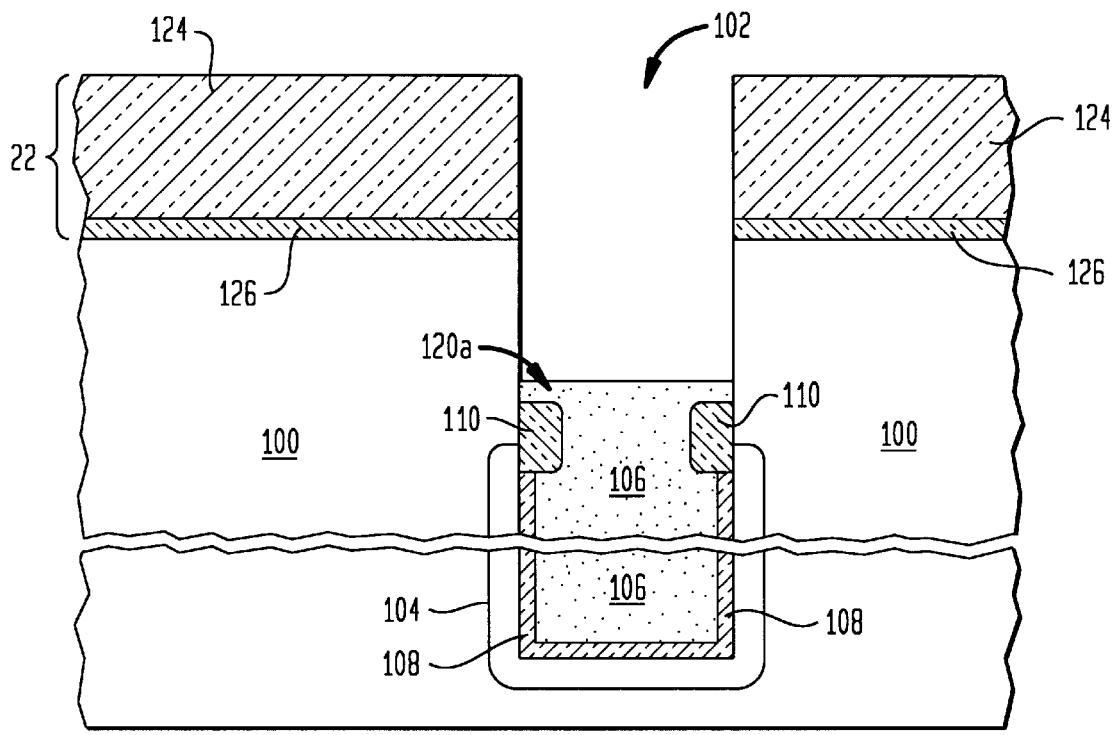
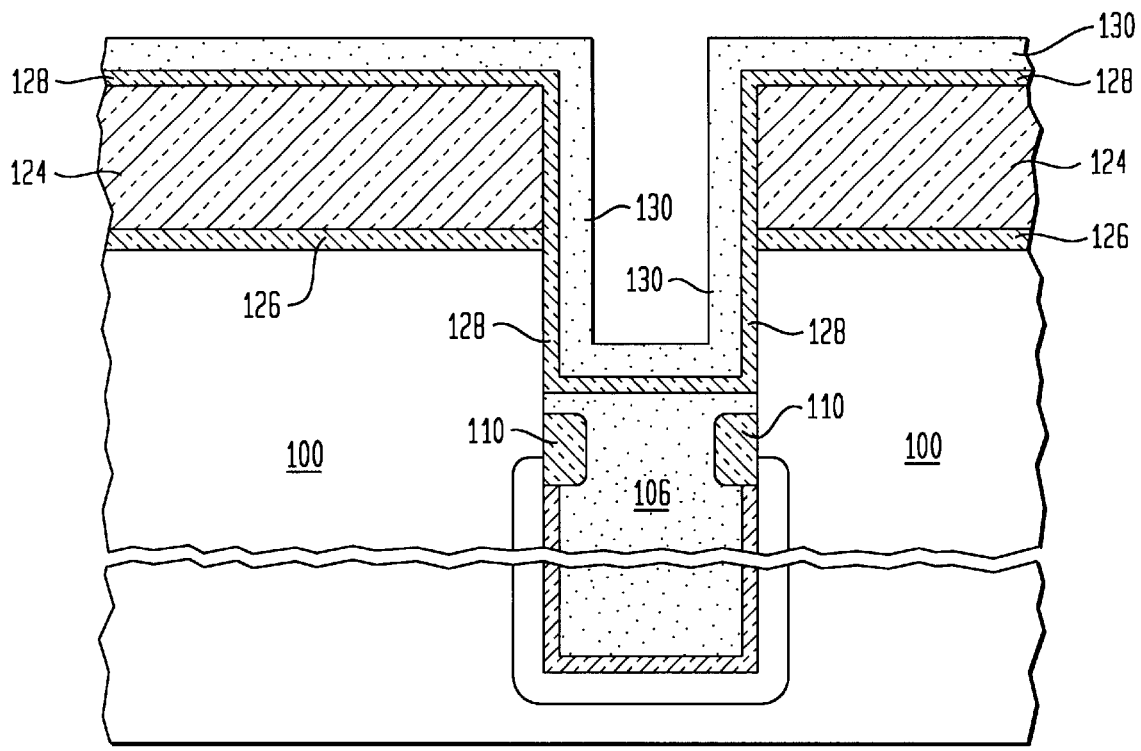

USE OF DUMMY POLY SPACERS AND DIVOT FILL TECHNIQUES FOR DT-ALIGNED PROCESSING AFTER STI FORMATION FOR ADVANCED DEEP TRENCH CAPACITOR DRAM

BACKGROUND OF THE INVENTION

This invention relates generally to Dynamic Random Memories (DRAMs) and more particularly to DRAMs having buried capacitors as the storage element thereof.

As is known in the art, it is frequently desirable to form regions of a semiconductor device below (i.e., buried beneath) the surface of a semiconductor substrate (i.e., body). More particularly, it is frequently desirable to form a first region in a semiconductor substrate beneath a surface of such substrate and aligned with a second region also disposed beneath the surface of the substrate. The formation of this first region is typically performed using a lithographic-etching processes. However, in order to form the first region, the mask used in the lithographic-etching process must be properly aligned with the second region which region is buried and thus not visible from the surface. Imprecise proper mask alignment may result in defects.

For example, in a DRAM cell having a buried trench capacitor coupled to a field effect transistor through a buried strap, or coupling region, it is desirable to form the buried strap in precise alignment with a sidewall of the trench after the trench has been formed and then covered with an insulating material. More particularly, after forming the trench, a dielectric liner (i.e., a node dielectric) is formed on the sidewalls of the trench. The trench is filled with a conductive material, typically doped polycrystalline or amorphous silicon. The filled trench is then recessed. A second dielectric layer is formed over the sidewalls exposed by the recess and over the conductive material in the trench the bottom of the recess. A reactive ion etch (RIE) is used to remove the second dielectric from the bottom of the recess while the portions of the second dielectric material remain on the sidewalls of the recess. The remaining second dielectric material forms a dielectric collar for the DRAM cell. Next, the recess is filled with a conductor, typically doped polycrystalline or amorphous silicon. Thus, the second doped material which is in contact with the first doped material together provide a storage node (i.e., electrode) for the buried capacitor. Next, the second doped silicon material is recessed a second time to expose upper portions of the dielectric collar. This exposed upper portion of the dielectric collar is removed together with exposed portions of the node dielectric layer, to thereby re-expose upper portions of the deep trench formed in the semiconductor substrate. Next, a third silicon material is deposed in the second recess to provide the buried strap.

Subsequently, the active area where the transistor is to be formed is delineated (i.e., defined) in the structure by a shallow trench isolation (STI) region formed in the structure. This STI region is then filled with an oxide to complete the isolation of the active area. This oxide fill involves a thermal cycle, for example, subjecting the structure to a temperature of 1000° C. or higher, for about 2 to 10 minutes. This high thermal cycle causes dopant in the buried strap provided by the doped polycrystalline material to out-diffuse into a portion of the active area where the drain region of the transistor will be formed. Unfortunately, the thermal cycle may result in a larger amount of out-diffusion then desired because of the relatively high temperature and relative long thermal cycle time. Thus, excessive out-diffusion may result.

This excessive out-diffusion, together with mask misalignments which may occur in the gate formation, may result in inadequate gate channel length for effective operation of the transistor.

One technique suggested is to form the buried strap subsequently to the STI delineation of the cells. With such suggested technique, however, the region in the semiconductor where the buried strap is to be formed (i.e., a region adjacent to the sidewall of the trench) is covered with the STI oxide. Therefore, when a mask is applied to the surface of the structure with an aperture which is to be placed over the region in the semiconductor where the buried strap is to be formed (i.e., a region adjacent to the sidewall of the trench), because the buried strap region is hidden by the STI oxide, a critical mask alignment step is required in order the etch into the semiconductor substrate at the precise location for the buried strap. That is, the mask must be precisely aligned with the sidewalls of the trench used to provide the trench capacitor and such sidewall is unfortunately, hidden by the STI oxide.

Another example where it is desirable to provide a the first region of a semiconductor substrate disposed beneath a surface of such substrate aligned with the second region after such second region is covered with a covering material is in the formation of a field effect transistor having a buried vertical gate channel region aligned with (i.e., having a predetermined lateral separation from) a vertical sidewall of a trench formed in the semiconductor substrate. In order to electrically isolate the transistor from other transistors formed in the semiconductor substrate the Shallow Trench Isolation (STI) technique described above is used. When it desirable to form the vertical gate channel region subsequent to forming the STI step, covering of the semiconductor substrate with the STI oxide conceals the region in the semiconductor substrate where the vertical trench sidewall is to be etched since it is hidden by the STI oxide. Thus, a critically aligned masking step is required to precisely form the buried vertical sidewall and hence the gate channel.

SUMMARY OF THE INVENTION

In accordance with the invention, a method is provided for forming a first region in a semiconductor substrate disposed beneath a surface of such substrate and aligned with a second region having a portion thereof also disposed in the semiconductor substrate beneath the surface of the semiconductor substrate. The method includes forming the second region in the semiconductor substrate, such second region having a sidewall portion provided by the semiconductor substrate. A sacrificial material is formed on the sidewall portion of the second region, such sacrificial material extending from the surface of the semiconductor substrate into the substrate beneath the surface of the semiconductor substrate. A covering material is formed over the surface of the semiconductor with a portion of the sacrificial material projecting through the covering material to expose a portion of the sacrificial material. The covering material and the exposed portion of the sacrificial material are subjected to an etch to selectively remove the sacrificial material while leaving the covering material. The removed sacrificial material exposes the sidewall portion of the second region. The first region is formed in the semiconductor substrate using the exposed portion of the second region as marker indicating position of the sidewall portion of the second region.

With such method, the first region is formed subsequent to the formation of the covering material without the use of lithography and critical alignment requirements associated with such lithography.

In one embodiment, after delineating an active area in the semiconductor substrate by providing a dielectric material over non-active areas of the semiconductor substrate, the selective removal of the sacrificial material exposes the buried strap region for a trench capacitor type DRAM cell. Material is then provided in such buried strap region which serves as the buried strap, such buried strap being contiguous to the trench capacitor sidewall.

In another embodiment, after delineating an active area in the semiconductor substrate by providing the covering dielectric material over non-active areas of the semiconductor substrate, the active area being covered with a second, different material, the selective removal of the sacrificial material exposes the sidewall of the trench capacitor. This exposed sidewall portion serves as a marker indicating the position of such sidewall. An etch is brought into contact with the different materials covering the active and non-active areas, such etch selectively removing portions of the second material to expose an underlying portion of the active area laterally spaced from the sidewall of the trench a selected distance. The exposed active area is etched anisotropically to provide a vertical surface laterally spaced from the sidewall by the selected distance. A field effect transistor for the cell is formed in the active area having a vertical gate channel along the vertical surface.

With such method, the vertical gate channel is formed the selected distance from the sidewall of the trench capacitor with requiring a lithography and the critical alignment requirements associated therewith.

In accordance with one embodiment, a method is provided for forming a dynamic random access memory cell in a semiconductor substrate, such cell having transistor in an active area of the semiconductor substrate electrically coupled to a storage capacitor through a buried strap, or coupling region. The method includes forming an electrode for the capacitor in a lower portion of a trench in the semiconductor substrate. A sacrificial material is formed on the sidewall portion of the trench, such sacrificial material extending from the surface of the semiconductor substrate into the substrate beneath the surface of the semiconductor substrate. The active area for the transistor is delineated and includes forming covering material over the surface of the semiconductor substrate with a portion of the sacrificial material being projecting through the covering material to expose such portion of the sacrificial material. The covering material and the exposed portion of the sacrificial material are subjected to an etch to selectively remove the sacrificial material while leaving the covering material, such removed sacrificial material exposing the first region of a semiconductor substrate disposed beneath a surface of such substrate. The selected material is provided the in the exposed portion of the first region of the semiconductor substrate.

In one embodiment, the step of delineating the active area includes subjecting the substrate to a temperature of at least 1000° C. for a period of time of at least 2 minutes.

In accordance with one embodiment, the method comprises forming a protective layer over the conductive material and over upper portions of the trench prior to delineating the active area; removing portion of the protective layer after delineation of the active area to re-expose upper portions of the trench; and forming the buried strap with such buried strap region being in contact with the re-exposed upper portions of the trench.

With such method, the region in the semiconductor substrate where the buried strap is provided is formed subsequent to the formation of the active area delineation without the use of lithography and critical alignment requirements associated with such lithography.

BRIEF DESCRIPTION OF THE DRAWINGS

Other features of the invention, as well as the invention itself, will become more readily understood from the following detailed description when taken together with the following drawings, in which.

DESCRIPTION OF THE PREFERRED EMBODIMENTS

Figure 1A:
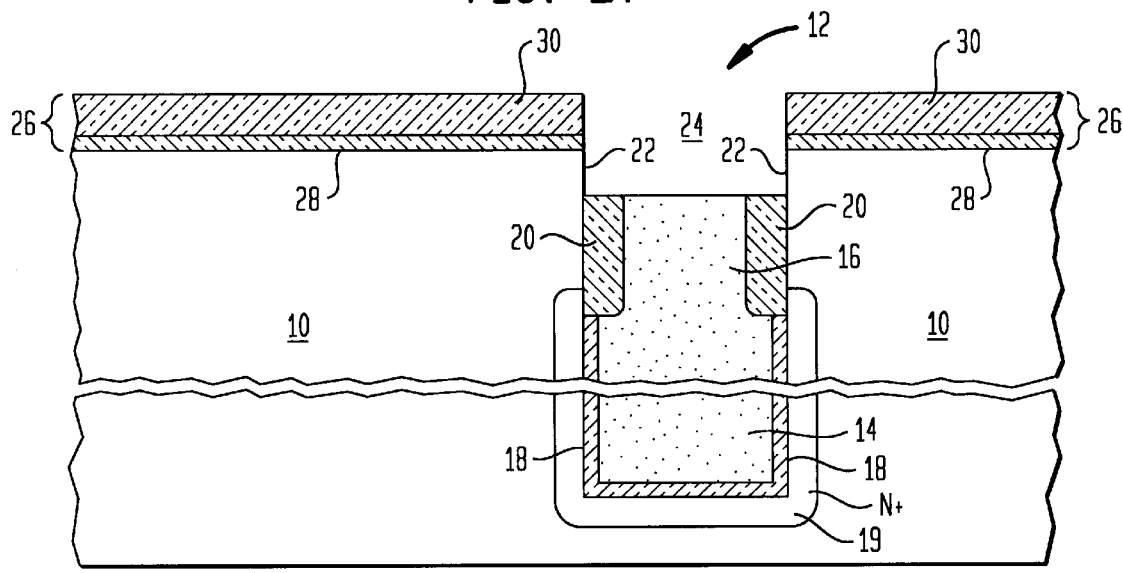
FIGS. 1A–1L are diagrammatical cross-sectional sketches showing fabrication of a DRAM cell in accordance with the invention at various stages in the fabrication thereof.
Figure 1B:
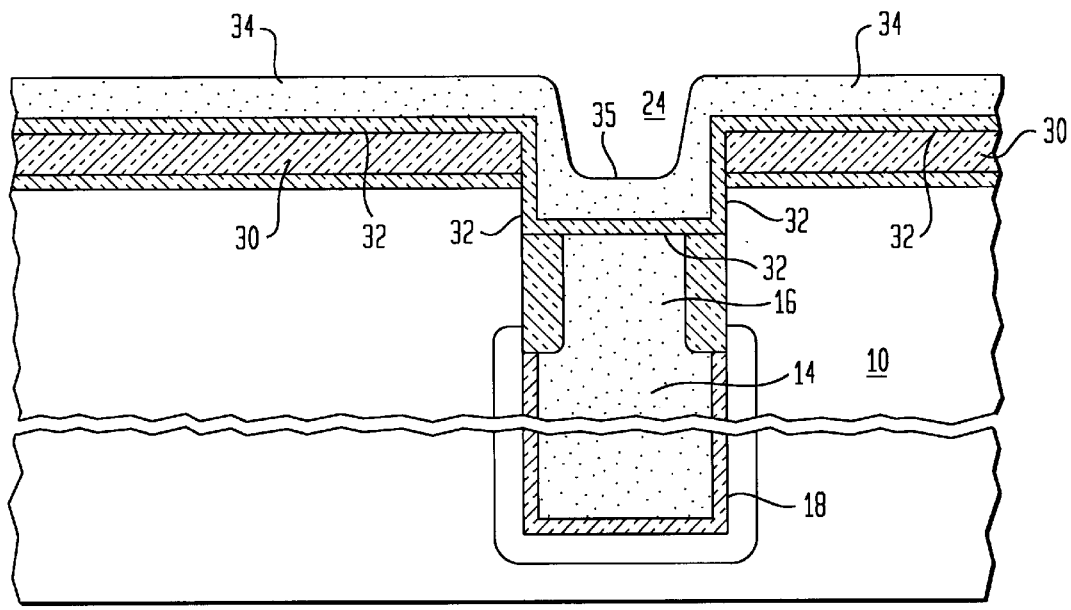
Figure 1C:
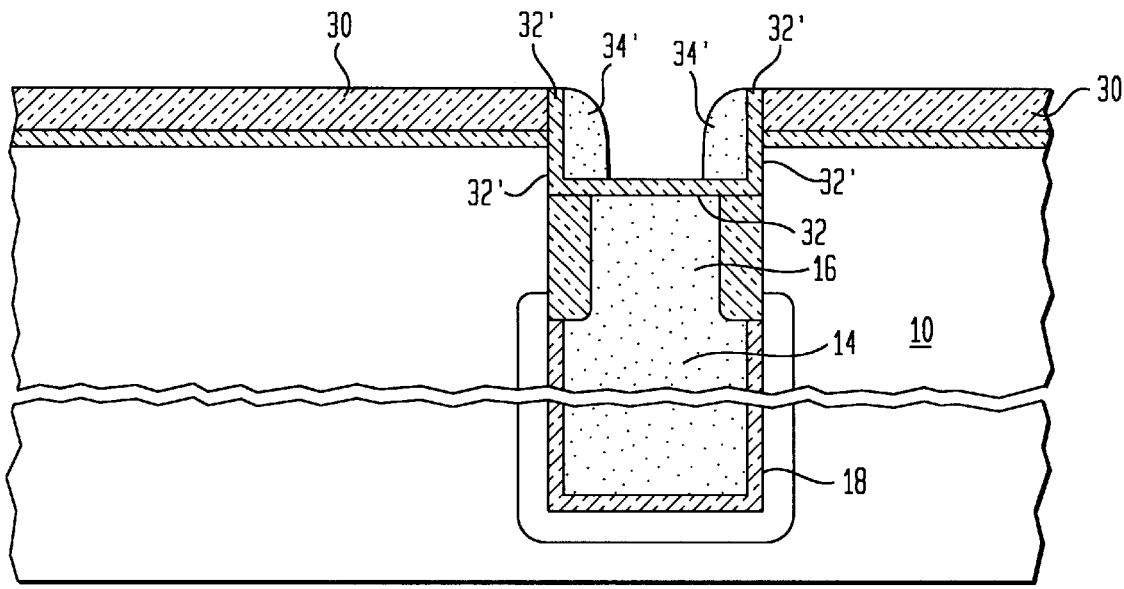
Figure 1D:
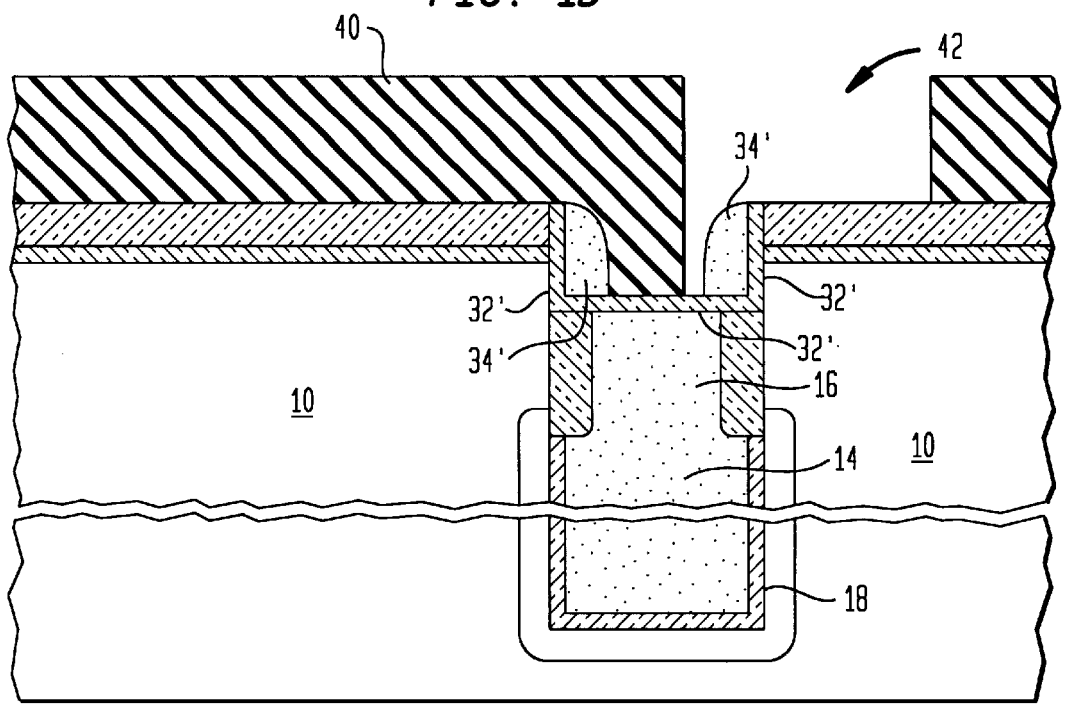
Figure 1E:
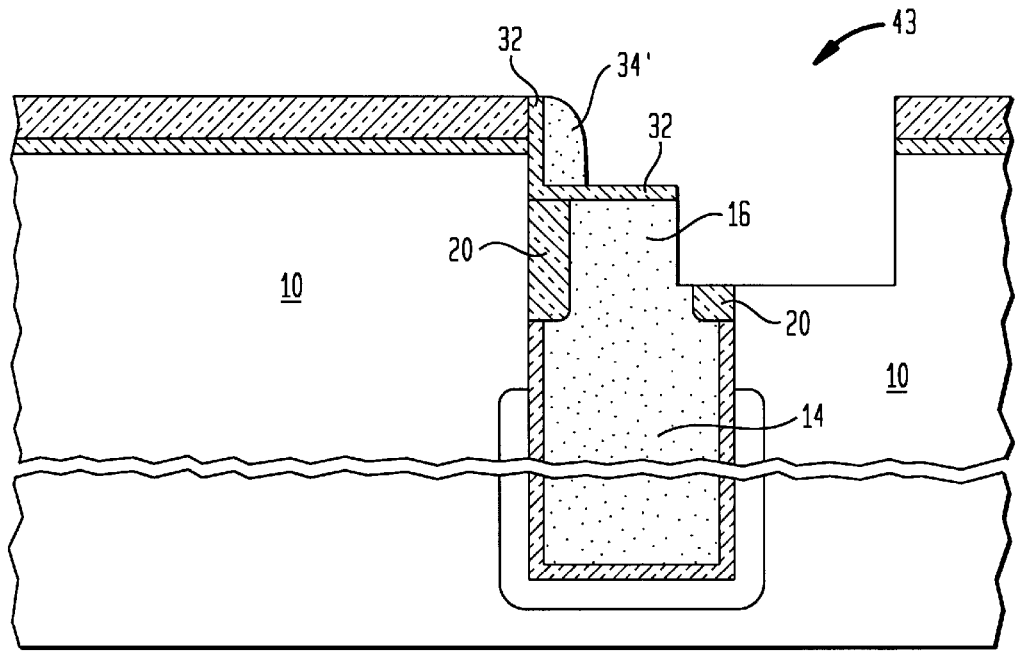
Figure 1F:
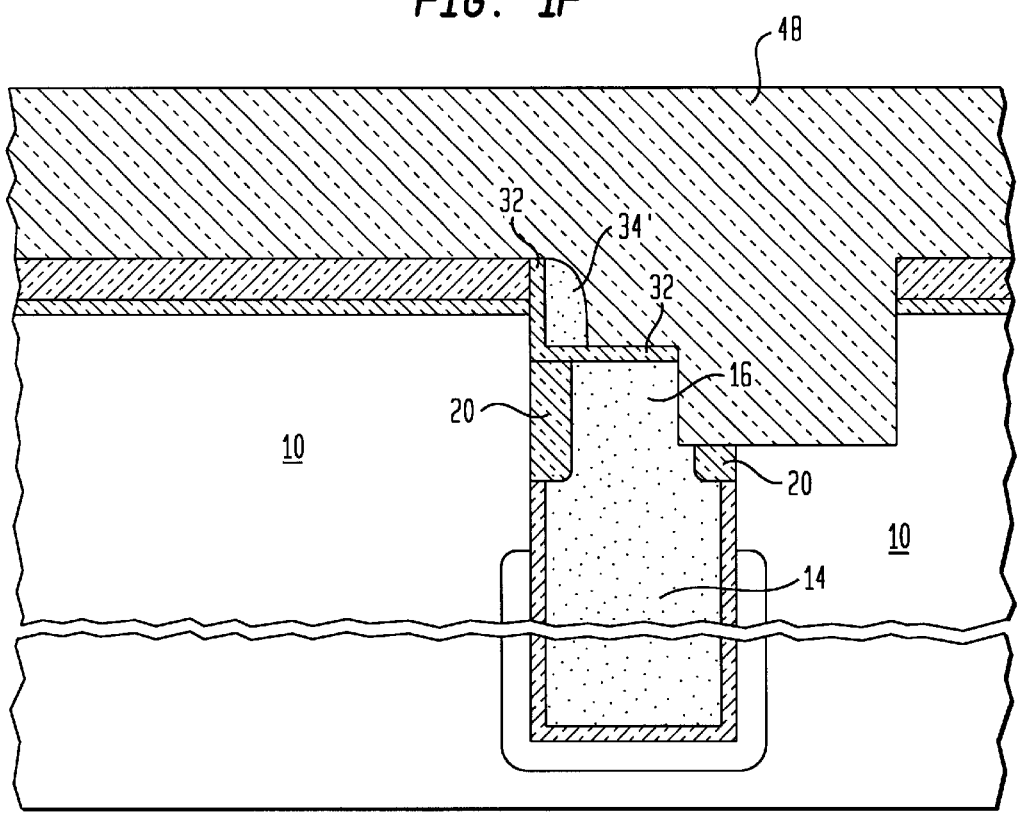
Figure 1G:
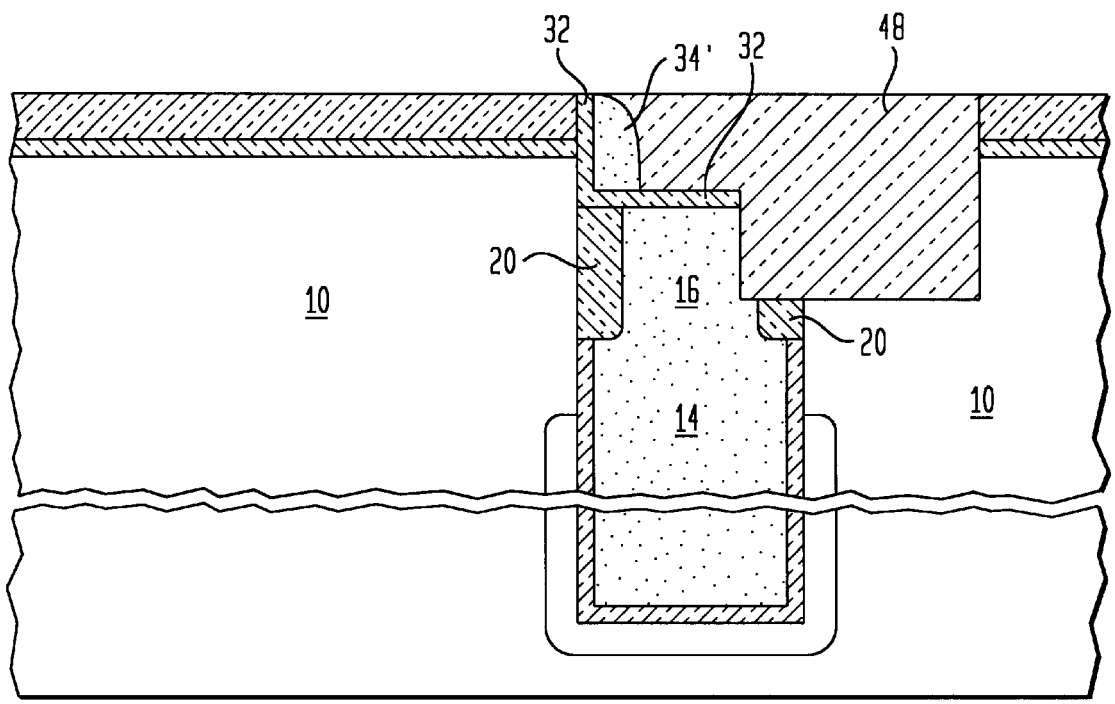
Figure 1H:
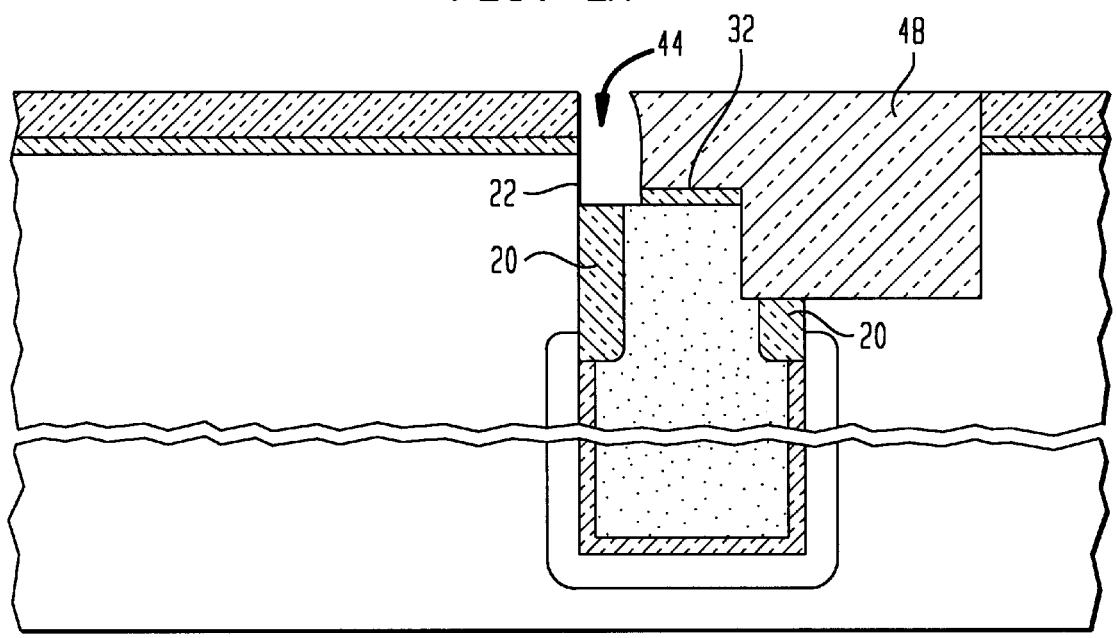
Figure 1I:
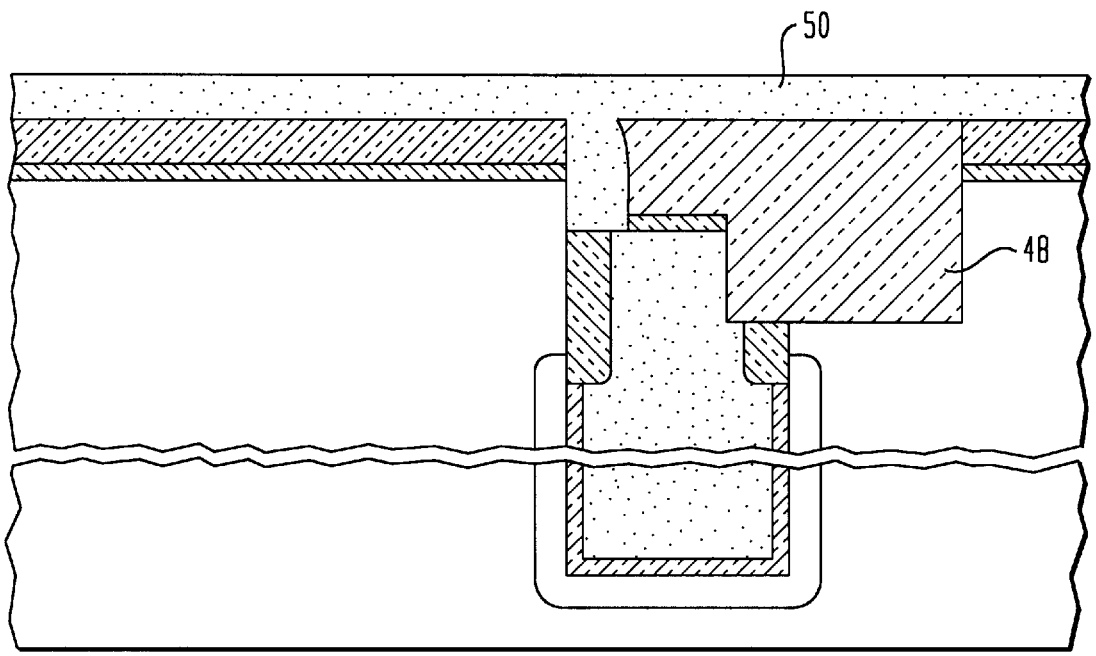
Figure 1J:
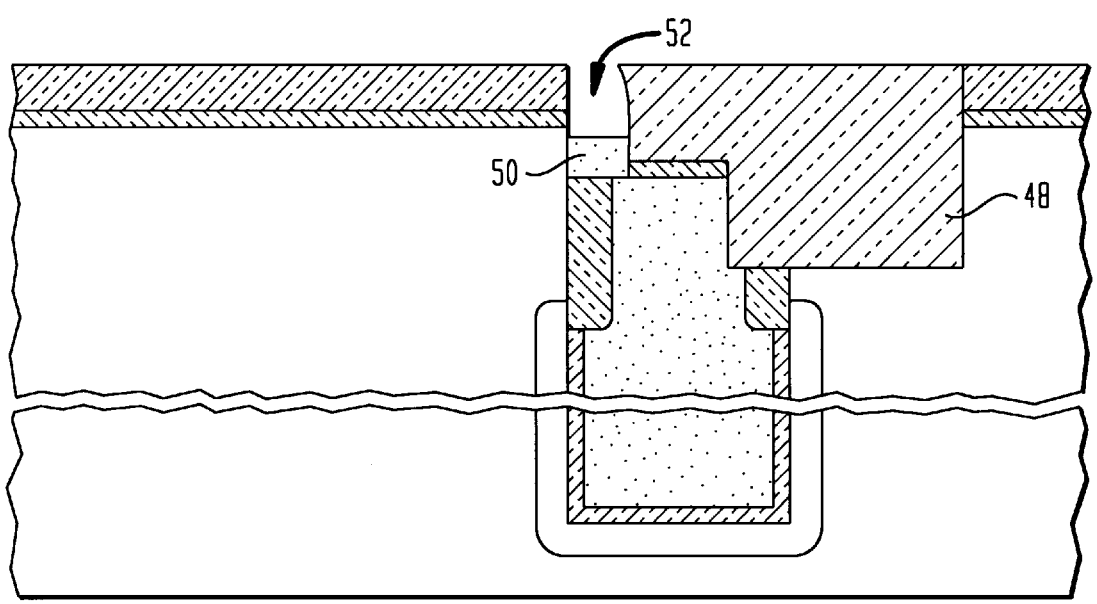
Figure 1K:
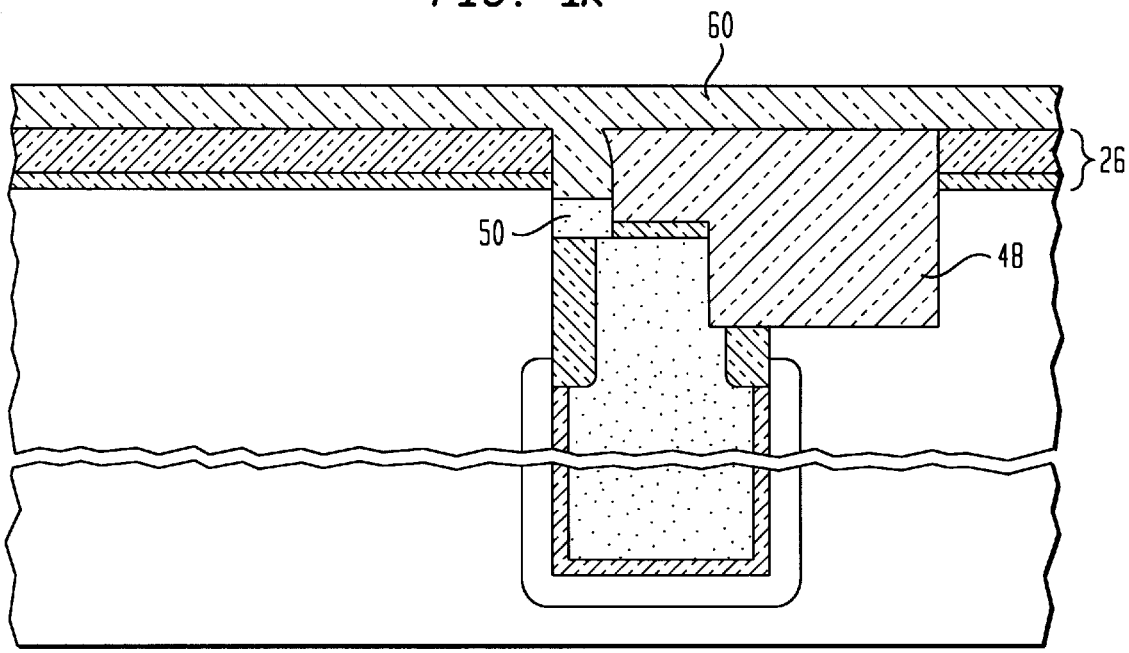
Figure 1L:
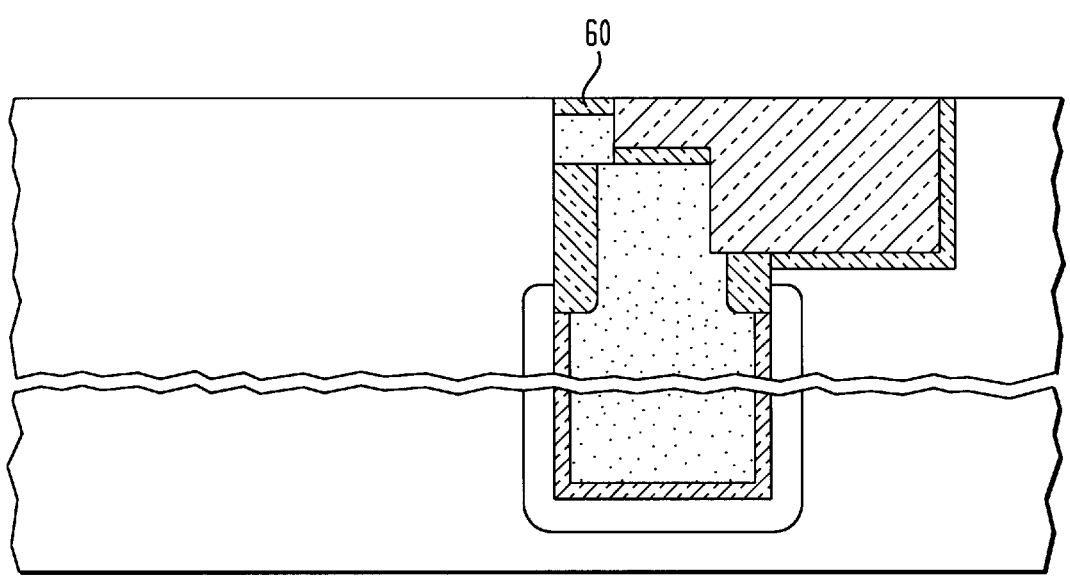
Figure 2:
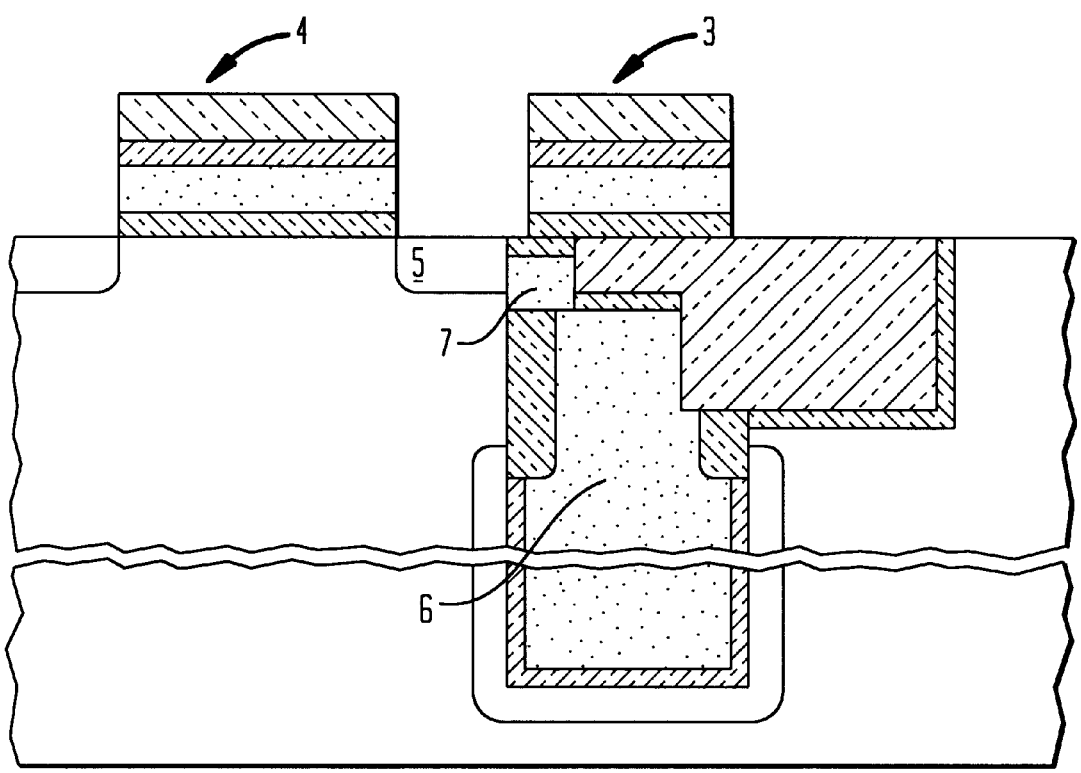
FIG. 2 is a diagrammatical cross-sectional sketch of the DRAM cell fabricated in accordance with the steps shown in FIGS. 1A–1L.

Referring now to FIGS. 1A through 1L, a method is described for forming a dynamic random access memory cell 3 shown in FIG. 2. The cell 3 includes a field effect transistor 4 having one of its source/drain region 5 electrically coupled to a storage capacitor 6 through a buried strap, or coupling region 7. As will be described, the region in the semiconductor substrate where the buried strap 7 is provided is formed subsequent to the formation of the STI without the use of lithography and critical alignment requirements associated with such lithography.

More particularly, referring to FIG. 1A, a semiconductor, here P type doped silicon, substrate, or body 10 is provided having formed therein a deep trench 12. Formed about the lower portion of the trench 12 is an $N^+$ doped region 19 using conventional processing. Formed in the deep trench 12, using conventional processing, are first and second doped polycrystalline silicon materials 14, 16 which together provide a storage node (i.e., capacitor electrode) for capacitor 6 (FIG. 2). It should be understood that other conductive materials, such as doped amorphous silicon may be used. The storage node 14, 16 is separated from the silicon substrate 10 by a node dielectric 18 disposed along a lower portion of the deep trench 12 and a dielectric collar 20 formed in the upper portion of the trench 12, upper portions of the dielectric collar 22 having been removed to expose portions 22 of the silicon substrate 10, thereby providing the structure shown in FIG. 1A. More particularly, a recess 24, here 50 nanometers (nm) deep, is formed in the upper portion of the doped polycrystalline silicon material 16 and exposed portions of the dielectric collar 20 are removed with a wet etch, in a conventional manner, to produce the structure shown in FIG. 1A. (It is noted that a pad stack 26 having a lower silicon dioxide layer 28, with an upper silicon nitride layer 30, are also provided prior to formation of the deep trench 12, node dielectric 18, dielectric collar 20, and storage node 14, 16).

Next, referring to FIG. 1B, the sidewall portions 22 (FIG. 1A) of the recess 24 are lined with sacrificial material, here such sacrificial material comprising: (1) a protective layer 32 of, here a silicon nitride, deposited over the structure shown in FIG. 1A with a thickness of, here, 5 nm; and (2), a thin layer of a polycrystalline silicon 34 deposited over the surface of the silicon nitride layer 32. Here, the polycrystalline silicon 32, is polycrystalline or amorphous silicon having a predetermined thickness, here 30–40 nm. Here, in this example, and while not required, an anisotropic silicon reactive ion etch (RIE) is used to remove the horizontally disposed portions of the polycrystalline silicon layer 34 and the then exposed horizontally disposed portions of silicon nitride layer 32. It is noted in FIG. 1C that vertically disposed portions of the polycrystalline silicon layer 34 (i.e., vertical portions 34') and vertically disposed portions of the silicon nitride 32 (i.e., vertical portions 32') remain. That is, as shown in FIG. 1C, here the structure is subjected to a reactive ion etch (RIE) removing horizontal surface portions 35 (FIG. 1B) of the polycrystalline silicon 34 which remained on the lower surface (i.e., bottom) of the recess 24 (FIG. 1B) while leaving vertical regions 34' of such polycrystalline silicon material 34 and vertical portions 32' of silicon nitride layer 32', as shown is FIG. 1C.

Next, the active area, in which the field effect transistor for the DRAM cell is to be formed, is delineated. More particularly, a photoresist layer 40 is deposited over surface of the structure shown in FIG. 1C and patterned using conventional lithography with a window 42 over the region where the STI is to be formed (i.e., the patterned mask covers the active area). The portions of the structure exposed by the window 42 in the photoresist layer 40 are etched to form the Shallow Trench Isolation (STI) region 43 (FIG. 1E). First a thin layer, not shown, of thermally grown silicon dioxide is grown over the silicon walls portions of the trench region 43. Here such silicon dioxide is grown by subjecting the structure to a high thermal cycle. For example, here the structure is subjected to a temperature of 1000° C. or higher, for about 5 to 10 minutes. It is noted that portions of the sacrificial material (i.e., the polycrystalline silicon 34' and the silicon nitride protective layer 32 covered by the patterned mask 40 (FIG. 1D)) remained disposed over a portion of the storage node 14, 16 during the formation of the STI region 43 (FIG. 1E) and during the formation of the dielectric material 48 (FIG. 1F). Thus, during the thermal cycle used in the formation of the dielectric material 48, portions of both the polycrystalline silicon 34' and the silicon nitride protective layer 32 are disposed over the doped polycrystalline materials 14, 16 which provide the storage node of the capacitor 6 (FIG. 2). Thus, the conductive material in the trench which provides the storage node is not in contact with the silicon substrate during this high thermal cycle. After thermally growing this thin silicon dioxide layer, dielectric material 48, here TEOS, is formed over the trench 43 fill the STI trench 43 (FIG. 1E) using conventional techniques to form the structure shown in FIG. 1F.

Referring to FIG. 1G, the upper surface of the structure shown in FIG. 1F is planarized by removing, such as with chemical mechanical processing (CMP) the upper portions of the TEOS 48. It is noted, however, the upper portions of the sacrificial material, (i.e., the silicon nitride liner 32 and the polycrystalline silicon 34') project through the remaining portions of the TEOS. That is, the sacrificial material, (i.e., the silicon nitride liner 32 and the polycrystalline silicon 34'), are exposed, as shown in FIG. 1G.

Next, referring to FIG. 1H, the upper surface of the structure shown in FIG. 1G is subjected to an etching process which selectively the sacrificial material (i.e., the exposed silicon nitride liner 32 and polycrystalline silicon 34'). Here, such etching process uses a chemical downstream etch (CDE) to remove the exposed portions of the polycrystalline silicon 34' portion of the sacrificial material. The exposed silicon nitride 32 portion of the sacrificial material is removed using a reactive ion etch or wet etch (e.g., hot phosphoric acid) thereby forming a divot 44 (FIG. 1H) of predetermined volume in the upper portion of the trench 12 (FIG. 1A), such divot 44 being aligned with (here, contiguous to) the silicon sidewall portion 22 (FIGS. 1A and 1H) of the deep trench 12.

Referring to FIG. 1I, an layer 50 of, for example, of doped or undoped amorphous or polycrystalline silicon, is deposited over the surface of the structure shown in FIG. 1H. The layer 50 is deposited with a predetermined thickness selected to fill the divot 44 (FIG. 1H), as shown in FIG. 1I. The surface of the structure is planarized using chemical mechanical processing or reactive ion etch (RIE), and then the material 50 is etched using RIE to form a recess, or gap 52 which is disposed below the surface of the pad nitride layer 30, as shown in FIG. 1J. Next, referring to FIG. 1K, a layer 60 of silicon oxynitride is deposited with a thickness of here 30 nm over the surface of the structure shown in FIG. 1J. It is noted that a portion of such layer 60 fills the gap 52 (FIG. 1J), as shown in FIG. 1K. The surface is then planarized as shown in FIG. 1L by etching the excess oxynitride layer 60. The pad layer 26 is then stripped using hot phosphoric acid to thereby produce the structure shown in FIG. 1L. The structure is then processed in any conventional way to form the DRAM cell 3 shown in FIG. 2.

Thus, it is noted that the sacrificial material (i.e., the silicon nitride liner 32 and the polycrystalline material 34' (FIG. 1G)) is formed on the sidewall portion of the trench 12 beneath the surface of the semiconductor substrate prior to the STI delineation of the active area in the substrate. The active area for the transistor is then delineated using STI and includes forming dielectric covering material (e.g. the oxide or TEOS 48, FIG. 1F) over the surface of the semiconductor substrate with a areas. Further, the sacrificial material (i.e., the nitride liner 32 and the polycrystalline material 34' 1G)) extends from the surface of the semiconductor substrate to the surface of the substrate and projects through the covering material 48 (FIG. 1G) to expose such portion of the sacrificial material (i.e., the nitride liner 32 and the polycrystalline material 34). The covering material 48 and the exposed portion of the sacrificial material (i.e, liner 32 and material 34') are subjected to an etch to selectively remove the sacrificial material 32, 34' while leaving the covering material 48 (FIG. 1H), such removed sacrificial material exposing the region 44 of a semiconductor substrate disposed beneath a surface of such substrate where the buried strap 7 is to be formed. The selected material, here the doped or undoped polycrystalline or amorphous silicon 50 (FIG. 1J) is provided the in the exposed portion (i.e., divot 44) of the semiconductor substrate which formed the buried strap. Thus, the sacrificial material 32, 34' (FIG. 1G.) provide a marker, or spacer, having a predetermined alignment with the sidewalls of the trench. This marker, or spacer, is maintained after the STI process. Thus, after the STI process, the exposed sacrificial material 32, 34' is selectively removed to expose the buried region in the semiconductor substrate where the buried strap 7 is to be formed. Thus, the region in the semiconductor substrate where the buried strap 7 may be formed subsequent to the formation of the STI without the use of lithography and critical alignment requirements associated with such lithography.

It should be noted if an undoped polycrystalline or amorphous silicon material 50 is used, during the formation of the gate oxide for the field effect transistor, dopant in the storage node diffuses into and through such undoped material 50 to thereby provide the conductive buried strap.

Figure 3C:
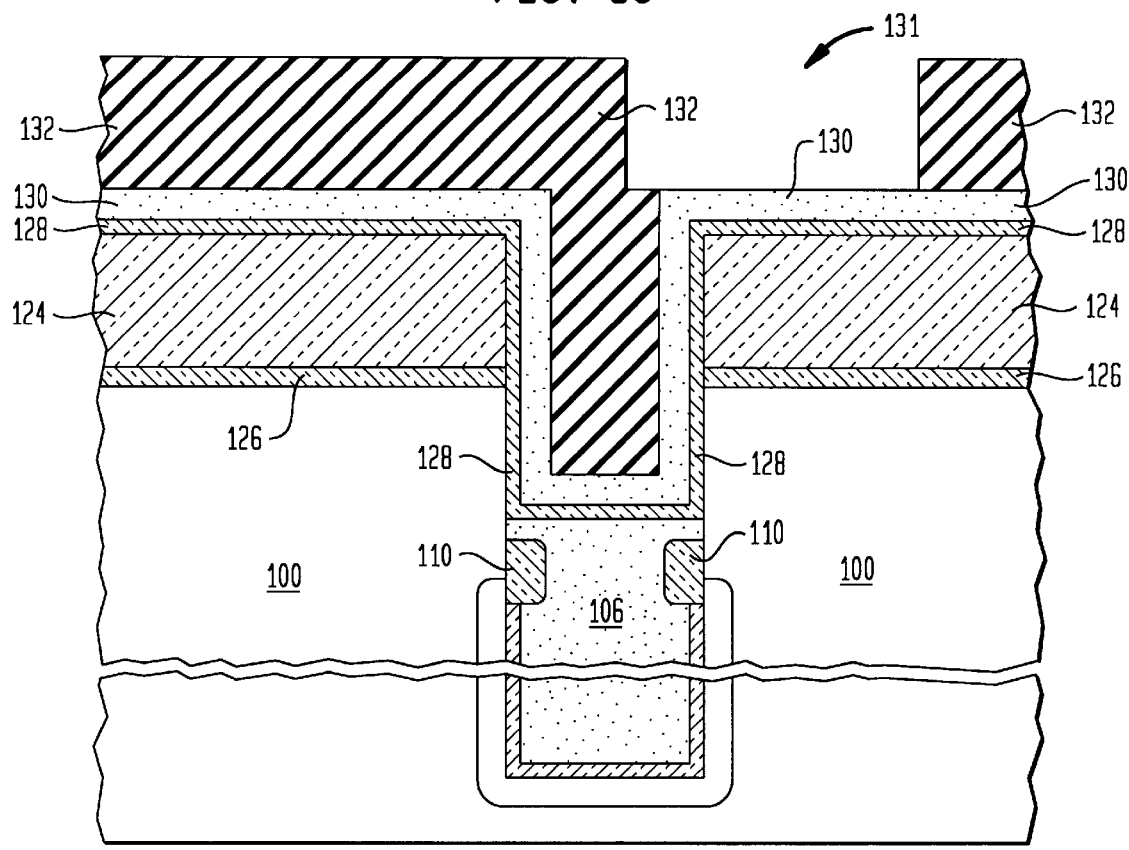
FIGS. 3A–3N are diagrammatical cross-sectional sketches showing fabrication of a DRAM cell in accordance with the another embodiment of the invention at various stages in the fabrication thereof.
Figure 3D:
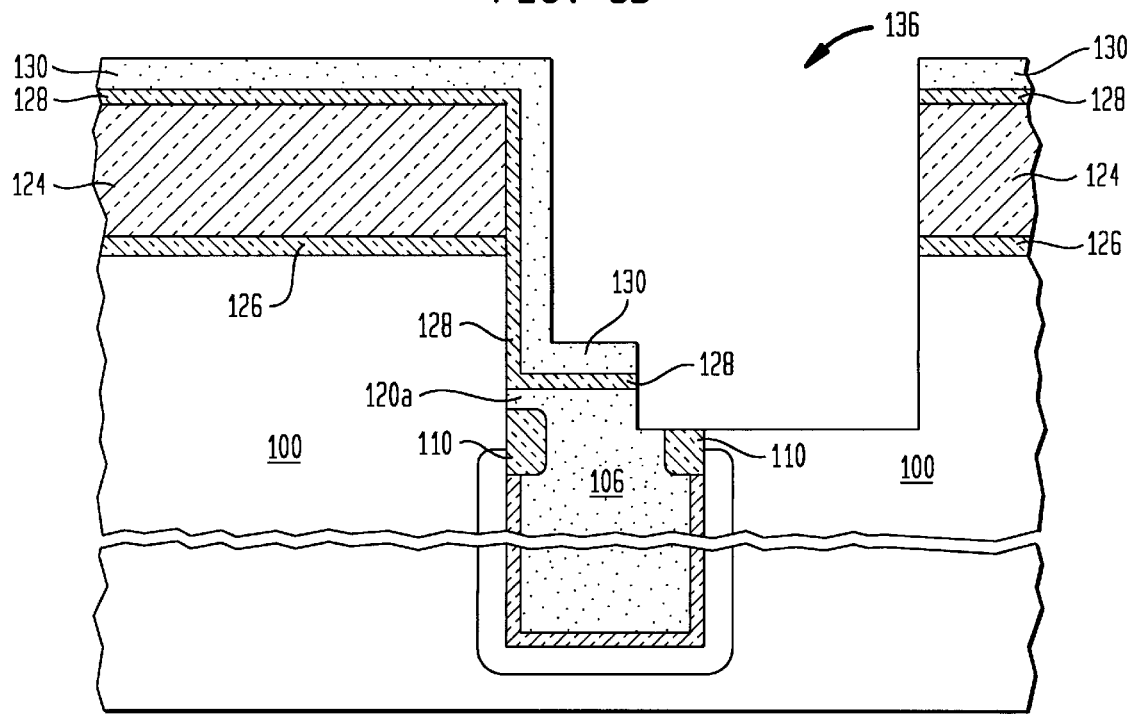
Figure 3E:
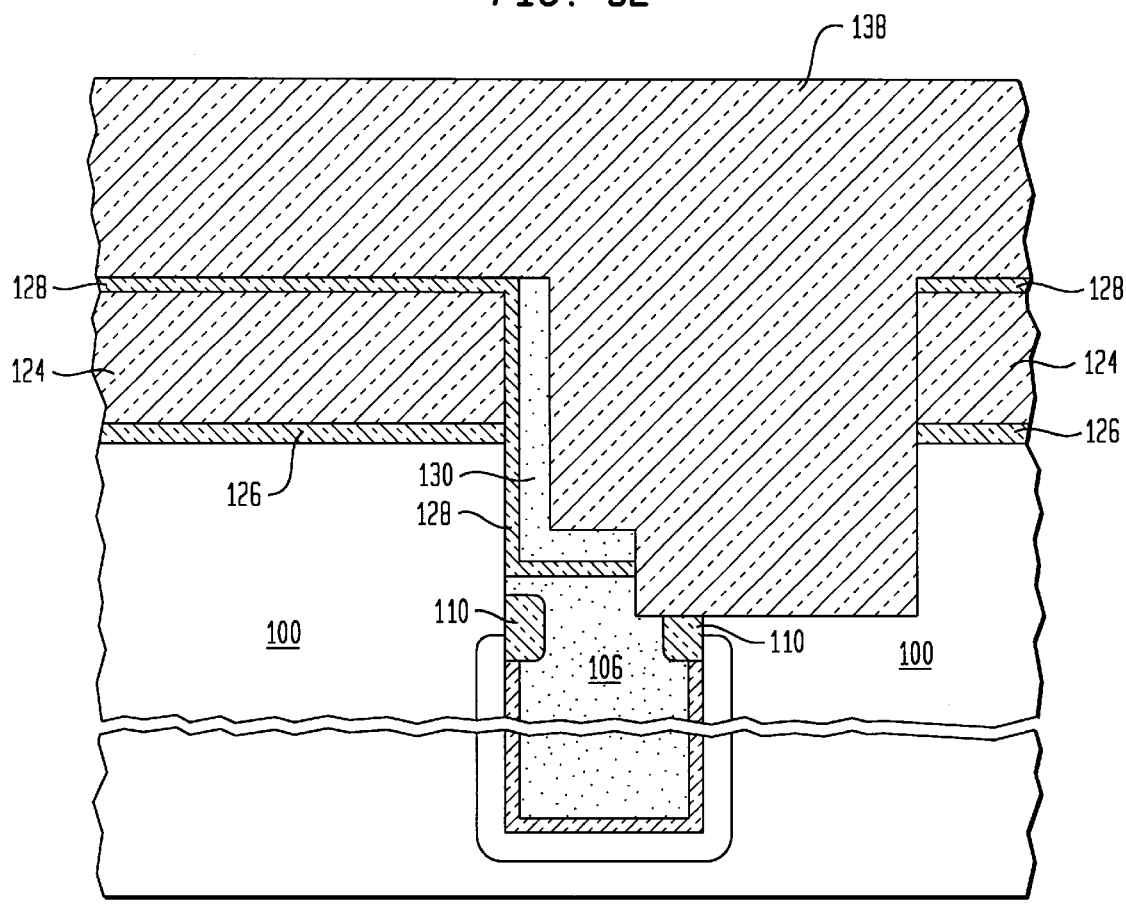
Figure 3F:
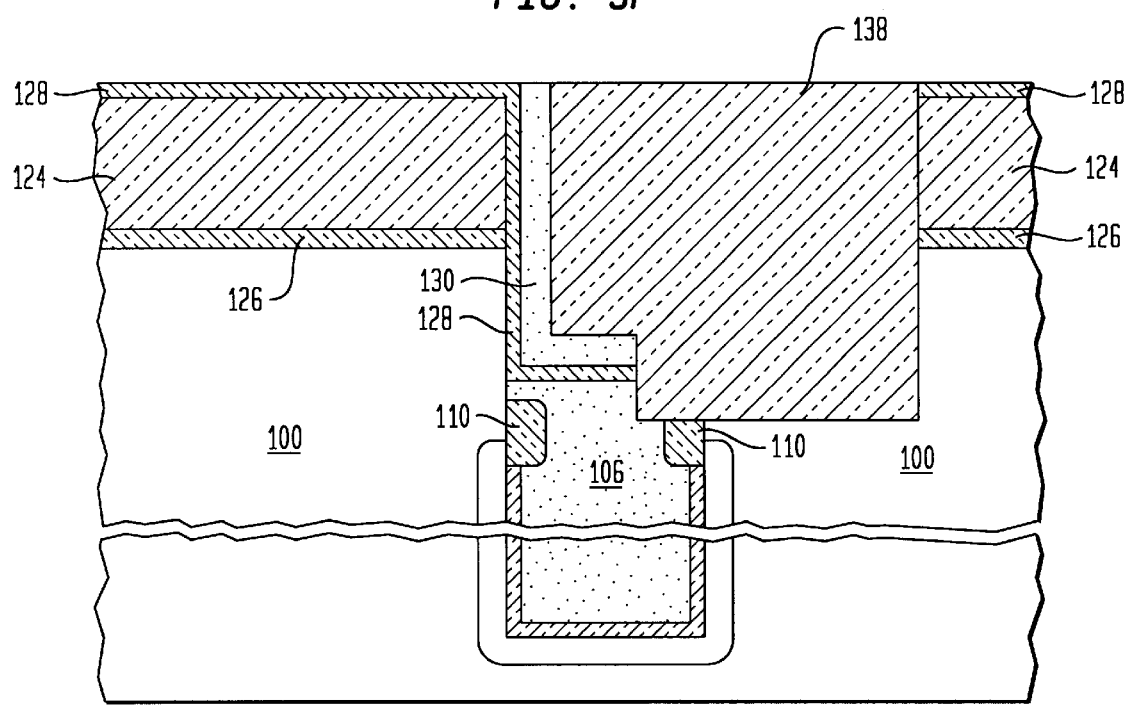
Figure 3G:
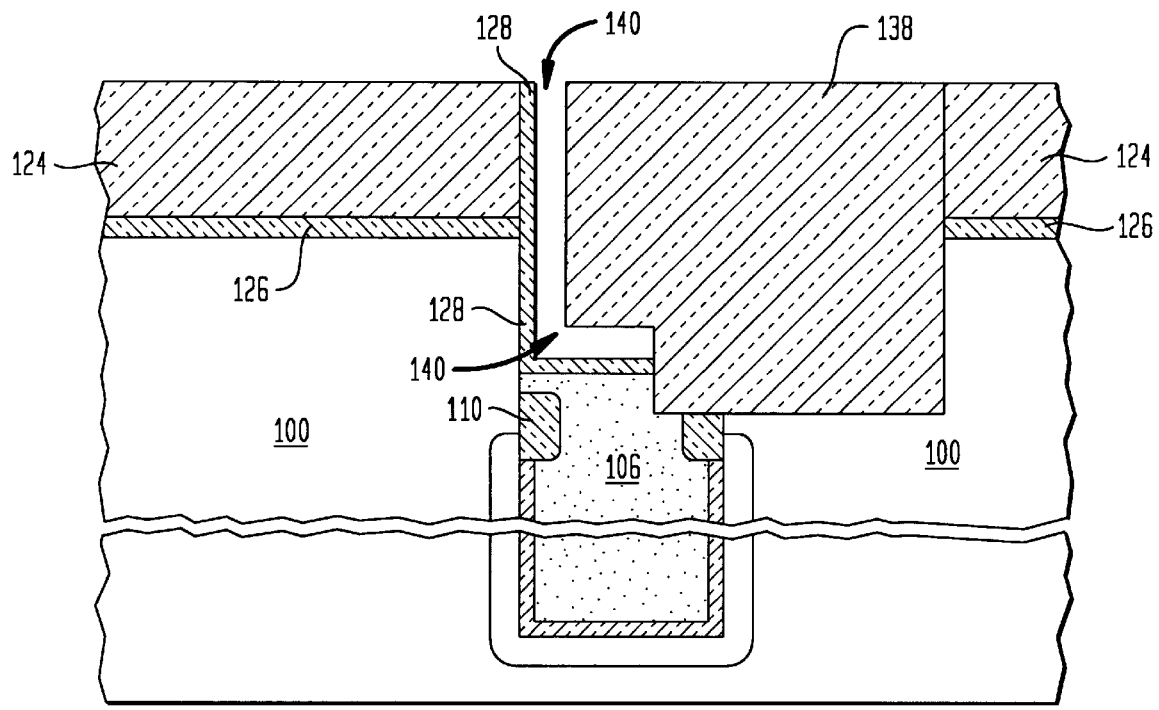
Figure 3H:
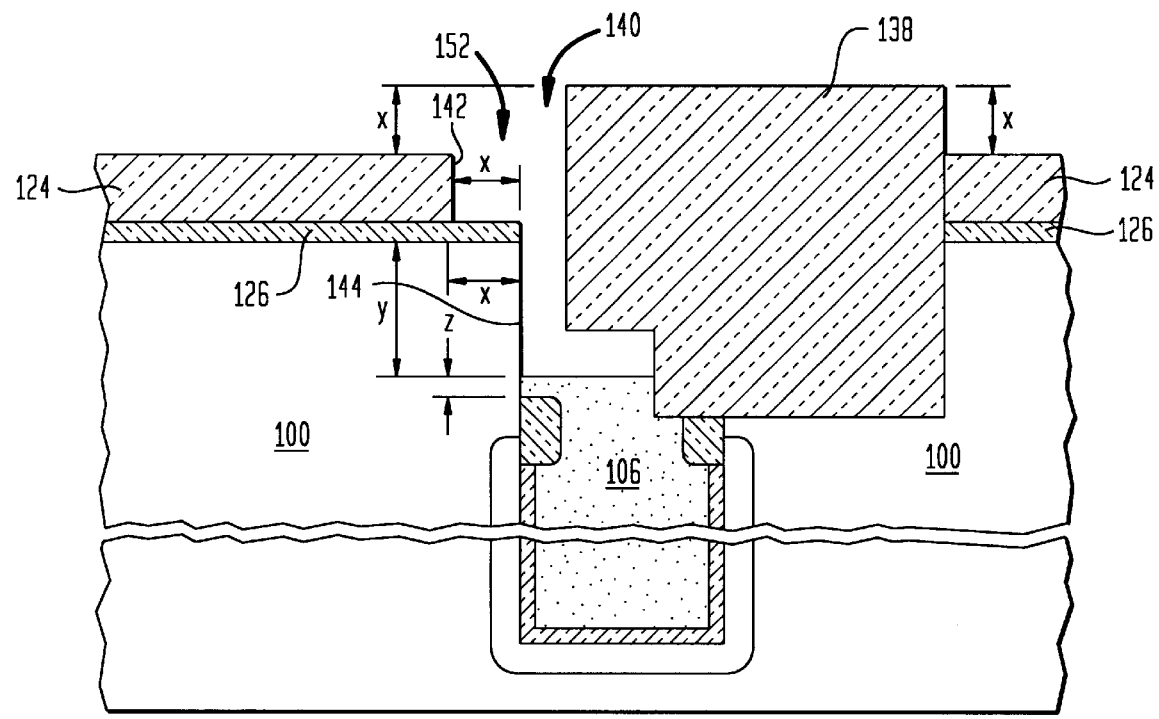
Figure 3I:
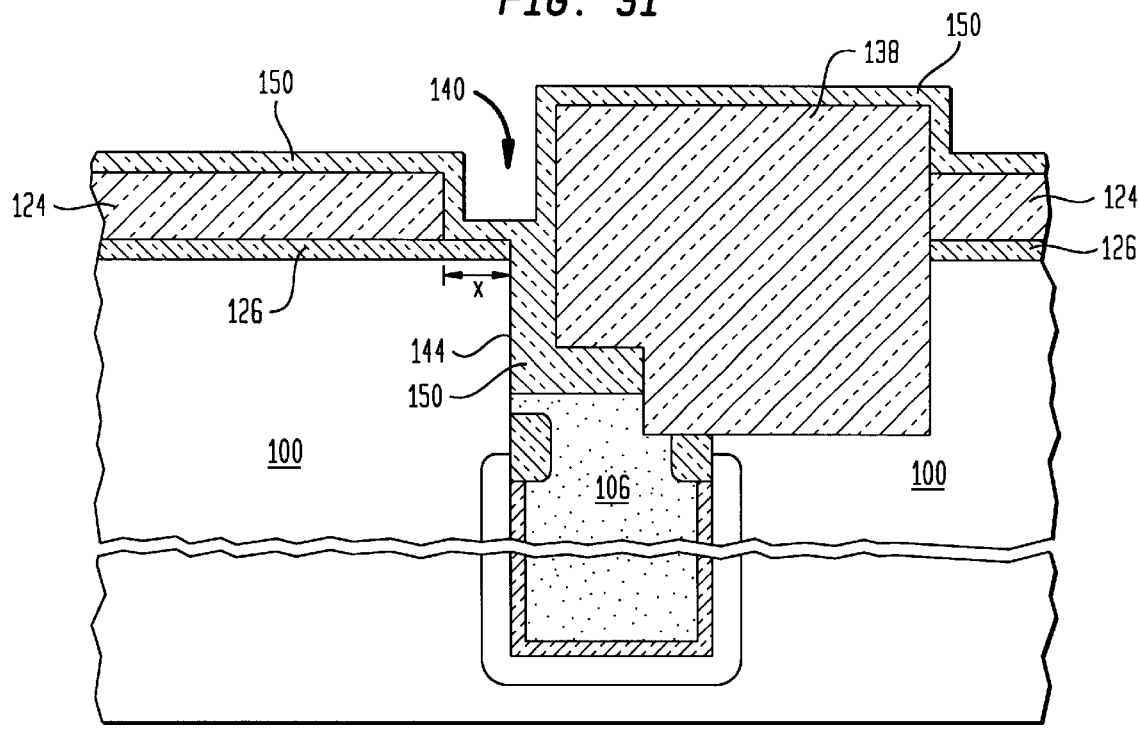
Figure 3J:
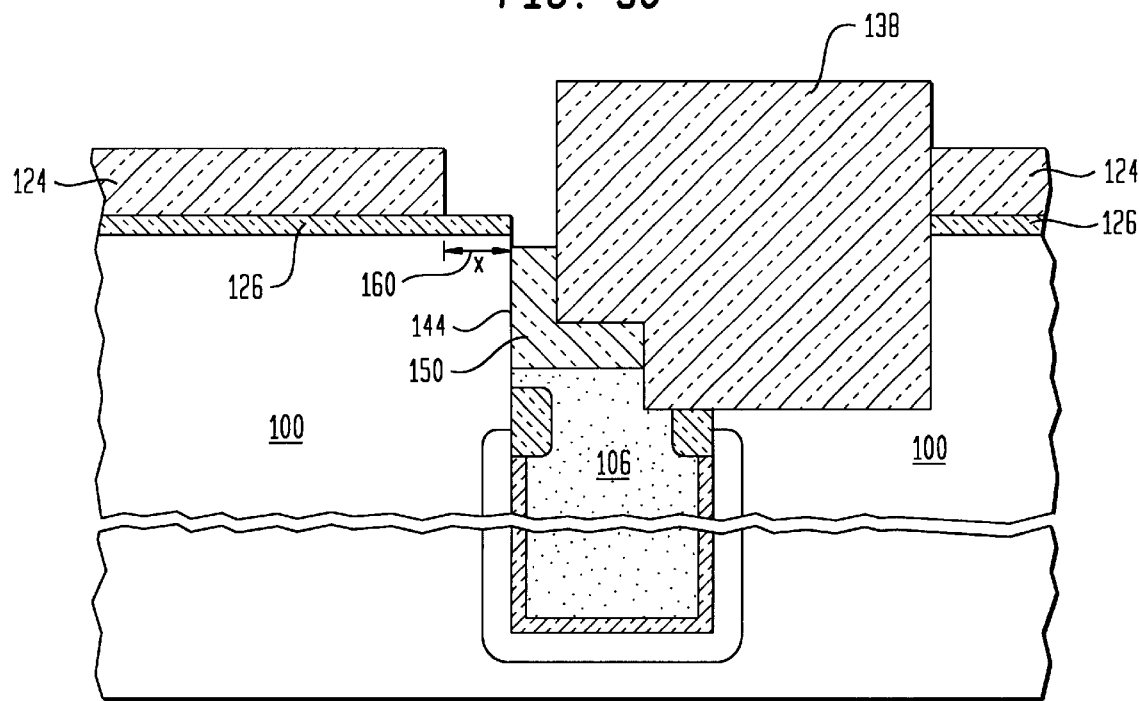
Figure 3K:
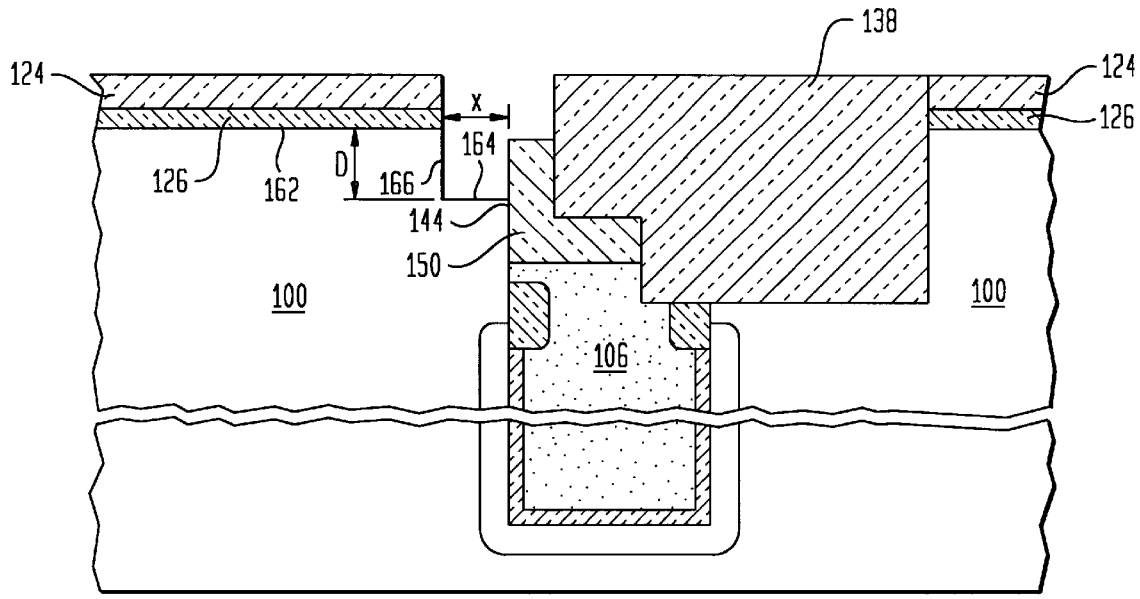
Figure 3L:
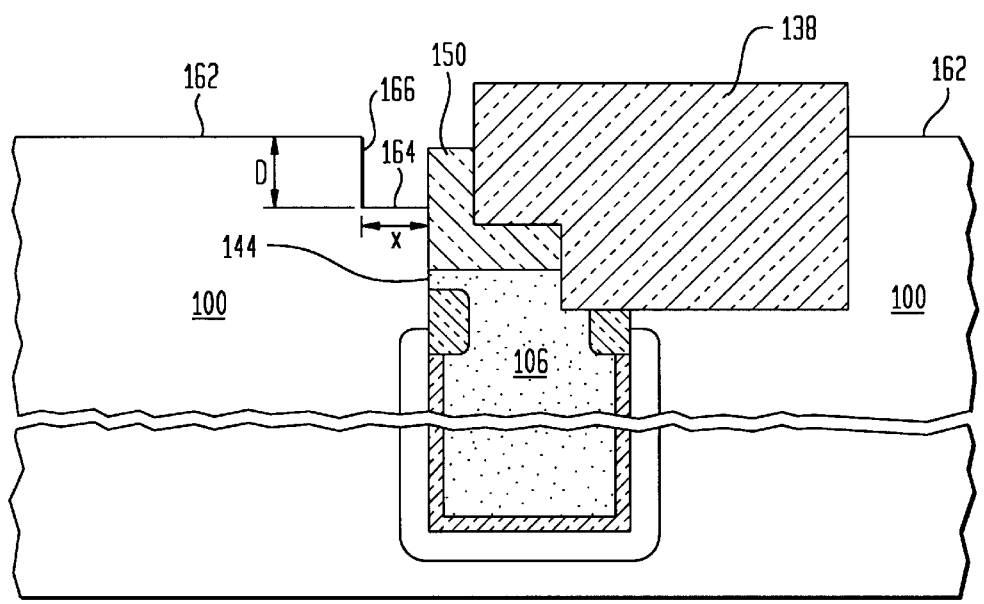
Figure 3M:
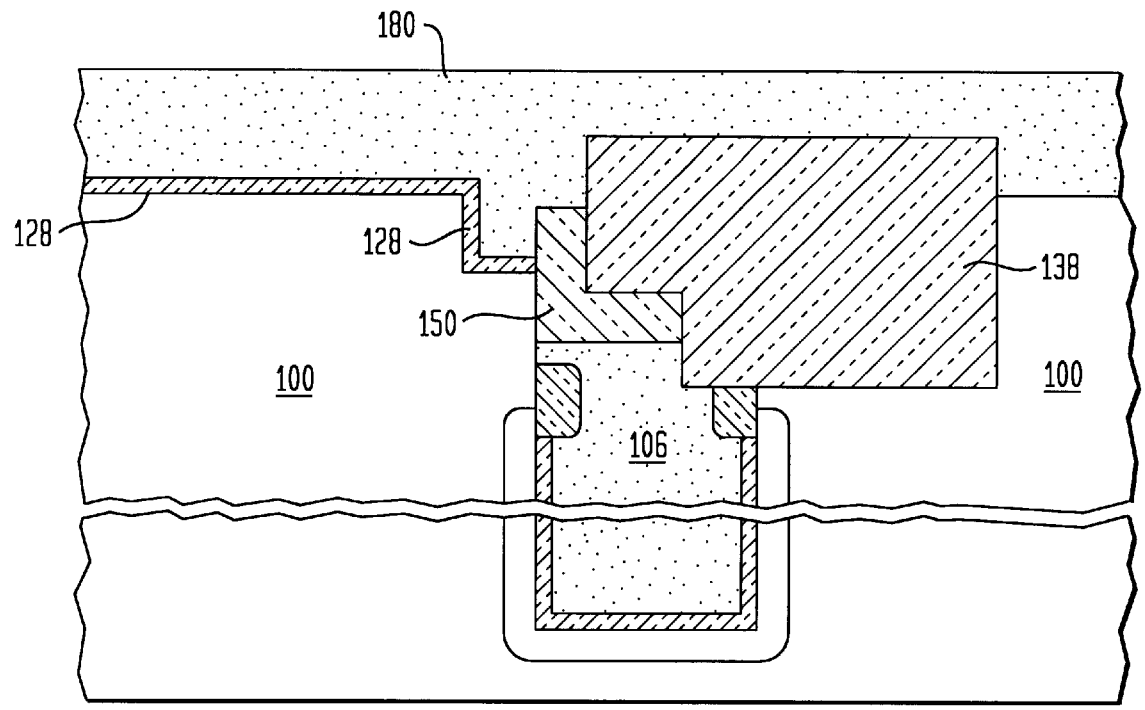
Figure 3N:
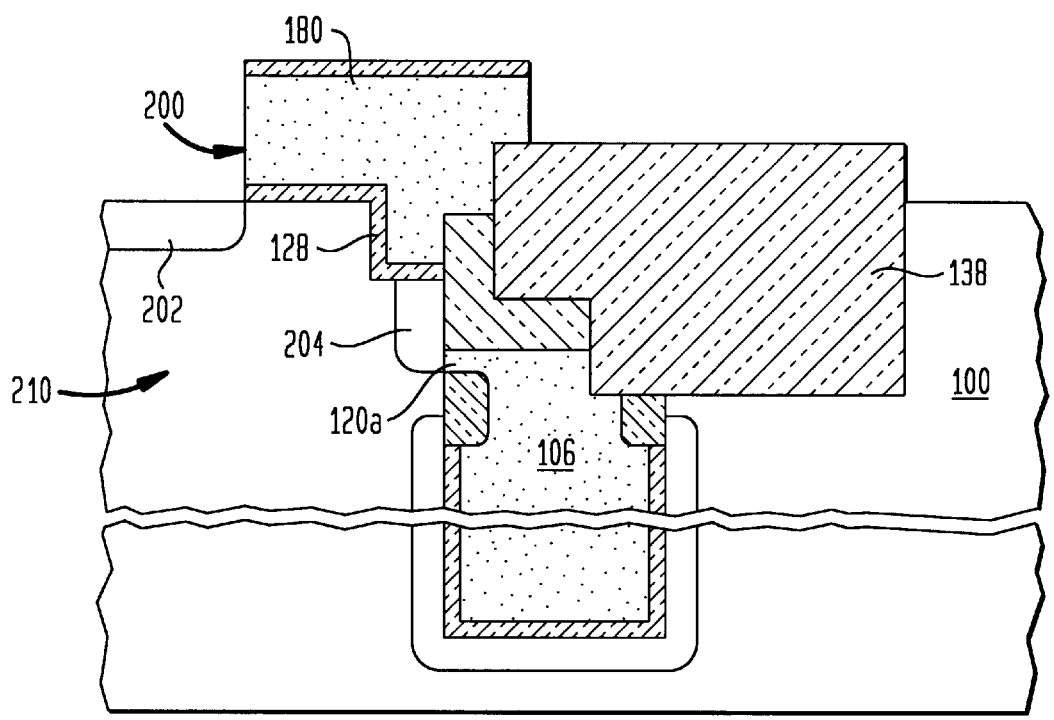

Referring now to FIGS. 3A through 3N a method is shown for forming a DRAM cell having a field effect transistor with a vertical gate channel buried within a semiconductor substrate and with a source/drain region coupled to a trench capacitor through a buried strap, as shown in FIG. 3N.

Thus, referring to FIG. 3A, a semiconductor, here P type doped silicon, substrate 100 is provided having formed therein a deep trench 102. Formed about the lower portion of the trench 12 is an $N^+$ doped region 104 using conventional processing. Formed in the deep trench 102, using conventional processing, is a conductive material 106, such as doped polycrystalline or amorphous silicon material to provide a storage node (i.e., capacitor electrode) for the capacitor of the DRAM cell. The storage node 106 is separated from the silicon substrate 100 by a node dielectric 108 disposed along a lower portion of the deep trench 102 and a dielectric collar 110 formed in the upper portion of the trench 12. The upper portion 112a of the conductive material 106 will provide the buried collar for the DRAM cell. It is noted that a pad stack 122 having a lower silicon dioxide layer 126, here for example, having a thickness of 50 A. with an upper silicon nitride layer 128, here having a thickness of 2000–3000 A, are also provided prior to formation of the deep trench 102, node dielectric 108, dielectric collar 110, and storage node 106, in any conventional manner.

Referring now to FIG. 3B. a layer 128 of silicon nitride is deposited over the surface of the structure shown in FIG. 3A, here such layer 128 having a thickness of 3 to 5 nanometers. Next, a layer 130 of polycrystalline silicon is deposited over the silicon nitride layer 128, here such layer 128 having a thickness of 40 nanometers. As will become evident below, the layer 128 of silicon nitride and the layer 130 of polycrystalline silicon provide a sacrificial material for processing subsequent to the delineation of the active areas here using STI to be described in connection with FIGS. 3C–3F.

Referring now to FIG. 3C, a photoresist layer 132 is deposited over the surface of the structure shown in FIG. 3B and is patterned as shown in FIG. 3C to cover the active areas where the transistor of the cell is to be formed, i.e., a window 134 is formed over the non-active, isolation regions used to delineate the active region. A shallow trench 136 is formed in the substrate 10 using conventional etching techniques to produce the structure shown in FIG. 3D. The trench is filled with dielectric material 138, here TEOS, using conventional processing to thereby produce the structure shown in FIG. 3E. The surface of the structure shown in FIG. 3F is planarized using processing described above in connection with FIGS. 1F and 1G to thereby produce the structure shown in FIG. 3F. It is noted that the upper portions of the sacrificial material (i.e., silicon nitride layer 128 and polycrystalline silicon layer 130 are exposed and project through the dielectric material 138, as shown. Further, it is again noted that the sacrificial material were deposited on the portions of the sidewall of the trench 100 (FIG. 3A and 3B).

Referring now to FIG. 3G, the exposed portions of the polycrystalline silicon layer 130 (FIG. 3F) are selectively removed in the manner described above in connection with FIG. 1H to thereby produce the structure shown in FIG. 3G with the removed polycrystalline silicon material 130 leaving a gap 140 in the upper surface of the structure. This gap 140 insures that the thickness of layer 150 is uniform over the surface of the oxide layer 126. Next, the exposed portions of the silicon nitride layer are etched using an isotropic wet etch, here hot phosphoric acid to produce the structure shown in FIG. 3H. The etch is selective to silicon nitride and does not significantly etch silicon or silicon dioxide. It is noted that the etch enters the gap 140 (FIGS. 3G and 3H) and laterally recesses the pad nitride a distance X (technically X minus the 3–5 nanometers thickness of the silicon nitride layer 128. In any event, the wall 142 of the pad nitride 134 is a predetermined distance from the sidewall 144 of the trench 102. It is noted that the height of the strap is Y, here about 400 nanometers.

Referring to FIG. 3I, the surface of the structure is coated with a dielectric layer 150, here silicon dioxide or silicon oxynitride, having a predetermined thickness of, here, for example, 25 nanometers. It is noted that the deposition of layer 150 is conformal and does not fill the recess 152 formed in the structure shown in FIG. 3H from the pad nitride etch back, or recess.

Referring now to FIG. 3J, using an isotropic or wet etch process selective to the material used for layer 150, here silicon dioxide or silicon oxynitride, the upper portions of such layer 150 are removed to produce the structure shown in FIG. 3J.

Next, using the exposed portions of the silicon dioxide layer is removed using a hydrofluoric acid wet etch, such process also removing upper portions of the dielectric material used for STI, thus exposing a portion 160 (FIG. 3J) of the silicon substrate 100. A RIE is used to selectively remove exposed portions of the exposed portion 160 (FIG. 3J) of the silicon. The RIE does not etch the silicon nitride or silicon dioxide (TEOS) and such material thus provide a RIE mask to recess the silicon having the width X a predetermined depth D from the upper surface 162 of the substrate 100. That is, a time controlled RIE etch is used to recess surface 164 of the silicon a predetermined depth D from the upper surface 162 of the substrate 100, where here, for example, D is 200–500 nanometers (nm). To put it another way, a step is formed in the silicon substrate 100 having a vertical wall 166, such wall 166 having a height D and such vertical wall 166 being spaced from the sidewall 144 of the trench the desired distance X. As will be shown, this vertical wall 166 provides the gate channel for the field effect transistor of the DRAM cell. It is also noted that such vertical wall 166 is formed subsequent to the STI without lithography and the critical alignment required therewith.

Referring now to FIGS. 3K and 3L, the silicon nitride layer 124 is selectively removed using hot phosphoric acid and the silicon dioxide layer 126 under the pad silicon nitride layer 124 is removed using a hydrofluoric acid containing etch thereby producing the structure shown in FIG. 3L.

Referring now to FIG. 3M, exposed surface portions 162 of the silicon substrate 100 are oxidized to form a conventional gate oxide 128. A layer 180 of doped polycrystalline silicon is deposited over the surface of the structure, to produce the structure shown in FIG. 3M. The structure is then processed in any conventional manner to produce the gate electrode 200 and source and drain region 202, 204 for the field effect transistor 210. The resulting DRAM cell is shown in FIG. 3N, such the transistor being electrically coupled to the trench capacitor though the coupling, i.e., buried strap, region.

Other embodiments are within the spirit and scope of the appended claims.

What is claimed is:

1. A method for forming a first region of a semiconductor substrate disposed beneath a surface of such substrate aligned with a second region, such second region having a portion thereof disposed in the semiconductor substrate beneath the surface of the semiconductor substrate, comprising:

forming the second region in the semiconductor substrate, such second region having a sidewall portion provided by the semiconductor substrate;

forming sacrificial material on the sidewall portion of the second region, such sacrificial material extending from the surface of the semiconductor substrate into the substrate beneath the surface of the semiconductor substrate;

forming covering material over the surface of the semiconductor substrate with a portion of the sacrificial material projecting through the covering material to expose such portion of the sacrificial material; and subjecting the covering material and the exposed portion of the sacrificial material to an etch to selectively remove the sacrificial material from the sidewall portion while leaving the covering material, such removed sacrificial material exposing the sidewall portion of the second region;

forming the first region in the semiconductor substrate using the exposed portion of the second region as marker indicating position of the sidewall of the second region.

2. A method for providing a selected material in a first region of a semiconductor substrate disposed beneath a surface of such substrate and aligned with a second region, such second region having a portion thereof disposed in the semiconductor substrate beneath the surface of the semiconductor substrate, comprising:

forming the second region in the semiconductor substrate, such second region having a sidewall portion provided by the semiconductor substrate;

forming sacrificial material on the sidewall portion of the second region, such sacrificial material extending from the surface of the semiconductor substrate into the substrate beneath the surface of the semiconductor substrate;

forming covering material over the surface of the semiconductor substrate with a portion of the sacrificial material projecting through the covering material to expose such portion of the sacrificial material;

subjecting the covering material and the exposed portion of the sacrificial material to an etch to selectively remove the sacrificial material while leaving the covering material, such removed sacrificial material exposing the first region of a semiconductor substrate disposed beneath a surface of such substrate;

providing the selected material in the exposed portion of the semiconductor.

3. A method for providing a selected material in a first region of a semiconductor substrate disposed beneath a surface of such substrate in contact with a sidewall portion of a trench disposed in the semiconductor substrate beneath the surface of the semiconductor substrate, comprising:

forming the trench in the semiconductor substrate with the sidewall portion of the trench being provided by the semiconductor substrate;

forming sacrificial material on the sidewall portion of the trench, such sacrificial material extending from the surface of the semiconductor substrate into the substrate beneath the surface of the semiconductor substrate;

forming covering material over the surface of the semiconductor substrate with a portion of the sacrificial material projecting through the covering material to expose such portion of the sacrificial material;

subjecting the covering material and the exposed portion of the sacrificial material to an etch to selectively remove the sacrificial material while leaving the covering material, such removed sacrificial material exposing the first region of a semiconductor substrate disposed beneath a surface of such substrate;

providing the selected material in the exposed portion of the semiconductor.

4. A method of forming a dynamic random access memory cell in a semiconductor substrate, such cell having transistor in an active area of the semiconductor substrate electrically coupled to a storage capacitor through a coupling region, such method comprising:

forming an electrode for the capacitor in a lower portion of a trench in the semiconductor substrate;

forming sacrificial material on the sidewall portion of the trench, such sacrificial material extending from the surface of the semiconductor substrate into the substrate beneath the surface of the semiconductor substrate;

delineating the active area for the transistor comprising forming covering material over the surface of the semiconductor substrate with a portion of the sacrificial material being projecting through the covering material to expose such portion of the sacrificial material;

subjecting the covering material and the exposed portion of the sacrificial material to an etch to selectively remove the sacrificial material while leaving the covering material, such removed sacrificial material exposing the first region of a semiconductor substrate disposed beneath a surface of such substrate;

providing the selected material in the exposed portion of the semiconductor.

5. The method recited in claim 4 wherein the step of delineating the active area includes subjecting the substrate to a temperature of at least 1000° C.

6. The method recited in claim 5 wherein the step of delineating the active area includes subjecting the substrate to such temperature for a period of time of at least 2 minutes.

7. The method recited in claim 4 including:

forming a protective layer over the conductive material and over upper portions of the trench prior to delineating the active area; and removing portion of the protective layer after delineation of the active area to re-expose upper portions of the trench;

forming the coupling region with such coupling region being in contact with the re-exposed upper portions of the trench.

8. The method recited in claim 7 including:

forming a sacrificial material over the protective, layer prior to delineation of the active area; and wherein the active area delineation includes:

forming a shallow-trench in a surface portion of the substrate, such shallow trench being formed in over a one portion of the capacitor, such shallow trench being inhibited from being formed over another portion of the capacitor, the sacrificial material being disposed over such another portion of the capacitor; and wherein, after such active area delineation, the buried strap formation includes:

removing the sacrificial material to provide a divot; and forming the buried strap in the divot.

9. A method of forming a dynamic random access memory cell in a semiconductor substrate, such cell having a source/drain region of a field effect transistor electrically coupled to a storage capacitor through a coupling region, such method comprising:

forming an electrode for the capacitor in a lower portion of a trench in the semiconductor substrate;

forming a sacrificial material with a predetermined thickness over the sidewalls of a first upper portion of the trench and a second material in a second upper portion of the trench contiguous to the sacrificial material;

selectively removing the sacrificial material to form a divot of predetermined volume in the upper portion of the trench aligned with the sidewall of the trench;

filling the divot with a third material to provide the coupling region; and diffusing dopant in the doped silicon through the coupling region to the source/drain region of the field effect transistor.

10. A method for forming a dynamic random access memory-cell in a silicon substrate, such cell having a source/drain region of a field effect transistor electrically coupled to a storage capacitor through a coupling region, such method comprising:

forming a doped silicon material electrode for the capacitor in a lower portion of a trench in the silicon substrate;

lining sidewalls of an upper portion of the trench with a protective layer;

forming a sacrificial material with a predetermined thickness over the lined sidewalls of a first upper portion of the trench and a second material in a second upper portion of the trench contiguous to the sacrificial material;

forming an isolation trench for the cell in the silicon substrate;

oxidizing the sidewalls to the isolation trench;

filling the isolation trench with a dielectric material;

selectively removing the sacrificial material to form a divot of predetermined volume in the upper portion of the trench aligned with the sidewall of the trench;

selectively removing the protective layer to expose the doped silicon material;

filling the divot with silicon to provide the coupling region; and diffusing dopant in the doped silicon material through the silicon coupling region to the source/drain region of the field effect transistor.

11. The method recited in claim 10 wherein the protective layer is silicon nitride.

12. The method recited in claim 11 wherein the sacrificial layer is silicon.

13. The method recited in claim 12 wherein the dielectric material includes silicon dioxide.

14. The method recited in claim 10 including forming a pad layer over the substrate prior to formation of the trench in the silicon substrate and wherein the step of filling the isolation trench with a dielectric comprises: depositing the dielectric over the pad layer with portions thereof filling the trench and extending above the trench; and, planarizing the deposited dielectric to a surface of the pad layer.

15. The method recited in claim 14 wherein the protective layer is silicon nitride.

16. The method recited in claim 15 wherein the sacrificial layer is silicon.

17. The method recited in claim 16 wherein the dielectric material includes silicon dioxide.

18. A method for forming a dynamic random access memory cell in a silicon substrate, such cell having a source/drain region of a field effect transistor electrically coupled to a storage capacitor through a coupling region, such method comprising:

forming a doped silicon material electrode for the capacitor in a lower portion of a trench in the silicon substrate;

forming an isolation trench for the cell in the silicon substrate;

oxidizing the sidewalls to the isolation trench;

filling the isolation trench with a dielectric material;

subsequently forming the coupling region; and diffusing dopant in the doped silicon material through the silicon coupling region to the source/drain region of the field effect transistor.

19. The method recited in claim 18 including the step of lining sidewalls of an upper portion of the trench with a protective layer;

forming a sacrificial material with a predetermined thickness over the lined sidewalls of a first upper portion of the trench and a second material in a second upper portion of the trench contiguous to the sacrificial material;

forming an isolation trench for the cell in the silicon substrate;

oxidizing the sidewalls to the isolation trench;

filling the isolation trench with a dielectric material;

selectively removing the sacrificial material to form a divot of predetermined volume in the upper portion of the trench aligned with the sidewall of the trench;

selectively removing the protective layer to expose the doped silicon material;

filling the divot with silicon to provide the coupling region.

20. The method recited in claim 19 wherein the protective layer is silicon nitride.

21. The method recited in claim 20 wherein the sacrificial layer is silicon.

22. The method recited in claim 21 wherein the dielectric material includes silicon dioxide.

23. The method recited in claim 18 including forming a pad layer over the substrate prior to formation of the trench in the silicon substrate and wherein the step of filling the isolation trench with a dielectric comprises: depositing the dielectric over the pad layer with portions thereof filling the trench and extending above the trench; and, planarizing the deposited dielectric to a surface of the pad layer.

24. The method recited in claim 23 wherein the protective layer is silicon nitride.

25. The method recited in claim 24 wherein the sacrificial layer is silicon.

26. The method recited in claim 25 wherein the dielectric material includes silicon dioxide.

27. A method for forming a dynamic random access memory cell in a silicon substrate, such cell having a source/drain region of a field effect transistor electrically coupled to a storage capacitor through a coupling region, such method comprising:

forming a doped silicon material electrode for the capacitor in a lower portion of a trench in the silicon substrate;

lining sidewalls of an upper portion of the trench with a protective layer;

forming a sacrificial material with a predetermined thickness over the lined sidewalls of a first upper portion of the trench and a second material in a second upper portion of the trench contiguous to the sacrificial material;

forming an isolation trench for the cell in the silicon substrate;

oxidizing the sidewalls to the isolation trench;

filling the isolation trench with a dielectric material;

selectively removing the sacrificial material to form a divot of predetermined volume in the upper portion of the trench aligned with the sidewall of the trench;

selectively removing the protective layer to expose the doped silicon material;

filling the divot with silicon to provide the coupling region; and etching back an upper portion of the divot filing silicon to provide a divot in such divot filling silicon;

filing the divot in the divot filling silicon second with a second dielectric material.

28. The method recited in claim 27 including the steps of:

removing upper portions of the second dielectric material and exposing an upper surface of the silicon substrate;

growing a gate oxide over the exposed surface of the silicon;

forming a gate electrode for the field effect transistor over the gate oxide.

29. The method recited in claim 28 wherein the protective layer is silicon nitride.

30. The method recited in claim 29 wherein the sacrificial layer is silicon.

31. The method recited in claim 30 wherein the first-mentioned dielectric material includes silicon dioxide.

32. The method recited in claim 30 wherein the second dielectric material includes silicon oxynitride.

33. A method for forming a dynamic random access memory cell in a silicon substrate, such cell having a source/drain region of a field effect transistor electrically coupled to a storage capacitor through a coupling region, such method comprising:

forming a doped silicon material electrode for the capacitor in a lower portion of a trench in the silicon substrate with an portion of such doped silicon material being in contact with the silicon trench sidewall to provide the coupling region;

lining sidewalls of an upper portion of the trench with a protective layer;

forming a sacrificial material with a predetermined thickness over the lined sidewalls of a first upper portion of the trench and a second material in a second upper portion of the trench contiguous to the sacrificial material;

forming an isolation trench for the cell in the silicon substrate;

selectively removing the sacrificial material to form a divot of predetermined volume in the upper portion of the trench aligned with the sidewall of the trench to expose the protective layer;

selectively removing the protective layer to expose the doped silicon material and upper portions of the silicon sidewalls of the trench above the coupling region;

filling the divot with a non-silicon material to provide a material along the upper portions of the silicon sidewalls of the trench above the coupling region; and selectively etching back an upper portion of the silicon contiguous to the non-silicon material, such non-silicon material protecting the doped silicon from the selective etching;

growing a gate oxide over the etched silicon sidewalls;

forming a gate electrode for the field effect transistor over the gate oxide, such transistor having a gate channel along a sidewall of the selectively etched silicon.

34. The method recited in claim 33 wherein the protective layer is silicon nitride.

35. The method recited in claim 34 wherein the sacrificial layer is silicon.

36. The method recited in claim 35 wherein the non-silicon material includes an oxynitride.

* * * * *